United States Patent
Hiraishi et al.

[11] Patent Number: 5,876,495
[45] Date of Patent: Mar. 2, 1999

[54] METHOD OF PULLING SEMICONDUCTOR SINGLE CRYSTALS

[75] Inventors: Yoshinobu Hiraishi; Shigeki Nakamura; Teruhiko Uchiyama, all of Kanagawa, Japan

[73] Assignee: Komatsu Electronic Metals Co., Ltd., Kanagawa, Japan

[21] Appl. No.: 990,573

[22] Filed: Dec. 15, 1997

[30] Foreign Application Priority Data

Dec. 13, 1996 [JP] Japan .................................. 8-352711

[51] Int. Cl.⁶ .................................................. C30B 15/20
[52] U.S. Cl. ................................. 117/20; 117/14; 117/15
[58] Field of Search .................. 117/14, 15, 19, 117/20

[56] References Cited

U.S. PATENT DOCUMENTS

| | | | |
|---|---|---|---|
| 5,215,620 | 6/1993 | Kodama et al. | 117/15 |
| 5,487,355 | 1/1996 | Chiou et al. | 117/14 |
| 5,578,284 | 11/1996 | Chandrasekhar et al. | 117/14 |
| 5,733,368 | 3/1998 | Nagai et al. | 117/14 |

*Primary Examiner*—Felisa Hiteshew
*Attorney, Agent, or Firm*—Sughrue, Mion, Zinn, Macpeak & Seas, PLLC

[57] ABSTRACT

This invention provides a method for pulling a single crystal silicon whose diameter is more than 200 mm. The single crystal silicon pulled by the method of this invention has a desired oxygen concentration and a uniform oxygen concentration distribution along its longitudinal axis. In the process of this invention, the single crystal silicon and the quartz crucible are driven to rotate in reverse directions, and the rotation speed of the single crystal silicon is set within the range of 8 to 16 rpm and to be more than twice the rotating speed of the crucible. The rotation speed of the crucible is set to be at its minimum value during pulling a body portion which begins from the beginning end of the single-crystal body and terminates at a location apart from the beginning end within a distance of 10% of the total length of the single-crystal body. Subsequently, the rotation speed of the crucible is gradually raised and is set to no more than a maximum value of 8 rpm.

7 Claims, 5 Drawing Sheets

METHOD OF PULLING SEMICONDUCTOR SINGLE CRYSTALS

BACKGROUND OF THE INVENTION

1. Field of the Invention

This invention relates to a method of manufacturing a semiconductor single crystal by the Czochralski Method (hereinafter referred as the CZ method), and in particular to a method of manufacturing a semiconductor single crystal having a diameter of more than 200 mm and a uniform distribution of oxygen concentration along its axis.

2. Description of the Related Art

The substrate for a semiconductor device is mainly made of high-purity single crystal silicon that is conventionally produced by the CZ method. In the CZ method, polycrystalline silicon nuggets are fed into a quartz crucible of a single-crystal silicon pulling apparatus. Then the quartz crucible is heated by heaters disposed therearound to melt the polycrystalline silicon nuggets. Thereafter a seed crystal installed on a seed chuck is dipped into the melt. After that, the seed chuck and the quartz crucible are respectively driven to rotate in the same or reverse directions, and at the same time the seed chuck is pulled to grow a single-crystal silicon ingot of a predetermined diameter and length. FIG. 6 is a partial cross-section schematic view showing a apparatus for pulling silicon semiconductor single crystals.

As shown in FIG. 6, within the main chamber 1, a graphite crucible 3 is disposed upon the upper end of a rotary crucible shaft 2 which can be driven to extend upward or downward. Melt 5 (formed by making polycrystalline silicon melted) is charged in a quartz crucible 4 accommodated within the graphite crucible 3. A cylindrical heater 6 and a heat insulating barrel 7 made of adiabatic material are disposed around the graphite crucible 3. Furthermore, a supporting member 8 is installed on the upper end of the heat insulating barrel 7, and a gas stream guide 9 in a shape of a truncated reversed cone is installed on the supporting member 8. Inert gas such as Argon is guided from a pull chamber (not shown) connected to the upper end of the main chamber 1. The inert gas enters the interior of the gas stream guide 9 and goes down along the single crystal silicon 10. Then the inert gas passes through the gap between melt 5 and the lower end of the gas stream guide 9. By this arrangement, $SiO_x$ evaporated from melt 5 can be expelled outside of the main chamber 1.

Due to the fact that the surface of the quartz crucible 4 is in contact with melt 5, oxygen contained in the surface of the quartz crucible 4 will dissolve into melt 5. Most of the oxygen dissolved in melt 5 evaporates from the free surface of melt 5 and is expelled, together with inert gas, outside of the main chamber 1. However, part of the oxygen enters the single crystal silicon being pulled. Usually, the oxygen concentration in a single crystal silicon is high at the beginning of pulling and then decreases as the increases solidification ratio of the single crystal silicon.

It is well known that the concentration of oxygen contained in a single crystal silicon can be homogenized in the longitudinal direction by controlling the rotation speeds of the crucible and the single crystal silicon. For example, a method for manufacturing single crystal silicon was disclosed in JP-B- 3-21515 [MEMC ELECTRONIC MATERIALS INC. USA] (the term "JP-B" as used herein means an published Japanese patent application). In the above method, the rotation speed of the single crystal is kept at a constant value greater than the maximum rotation speed of the crucible, and the maximum rotation speed of the crucible is controlled not to exceed the rotation speed of the single crystal in the event that the length of the single crystal is increasing. Thus, the distributions of oxygen concentration in the longitudinal and radial directions of the single crystal can be made uniform.

The above method is only suitable for the case where single crystals of a diameter less than 100 mm and a single crystal pulling apparatus without a gas stream guide are used. However, for single crystals with larger diameters than 200 mm, it is difficult to homogenize the distribution of oxygen concentration therein by only controlling the rotation speeds of the crucible and the single crystal. The reasons are: (1) Even if the rotation speed of the single crystal is kept constant, the moving speed in the peripheral direction at the boundary of liquid and solid will increase in proportion to the increase of the single-crystal diameter. There is a limit to the above moving speed in the peripheral direction that can steadily grow single crystals. In the case of a single crystal with a diameter of more than 200 mm, its rotation speed is limited to about 50% of that disclosed in JP-B 3-21515. (2) The peripheral speed of the quartz crucible also increases due to the enlargement of its diameter, and waves raised by the error in circularity of the quartz crucible or the eccentricity induced by dislocation of the quartz crucible during installation, on the free surface of melt become intense. Accordingly, it is difficult to obtain the steady growing of single crystals, and still the rotation speed is limited to about 50% of that disclosed in JP-B 3-21515. (3) If the rotation speed of the crucible is less than 5 rpm, natural convection in the melt, that is, the upward and downward convections become dominant, and horizontal convections are hindered. Therefore, oxygen concentration in single crystals can not be controlled, and the range in which the oxygen concentration can be controlled becomes very narrow. Accordingly, it is difficult to maintain uniform oxygen concentration along the longitudinal axis of a single crystal. (4) Depending on the design of the hot zones (melt portion), if the rotation speed of a single crystal is occasionally raised too high, the outer peripheral surface of the crystal will become uneven and no longer cylindrical. In the case of pulling a single crystal with a diameter of more than 200 mm, the maximum rotation speed of the crystal is about 20 rpm. Thus, even if it is intended to keep the oxygen concentration along the radial axis uniform, the rotation speed of the crucible can not be raised to half of that value of the crystal. Accordingly, the oxygen concentration in the single crystal can not be raised, and it is difficult to maintain a uniform oxygen concentration in the longitudinal direction.

SUMMARY OF THE INVENTION

In view of the above defects, the object of the present invention is to provide a method for pulling single crystals silicon. According to the method of this invention, a single-crystal silicon having a diameter of more than 200 mm can be manufactured, and a uniform distribution of preset oxygen concentration along its longitudinal axis can be achieved.

To achieve the above object, according to this invention, in the process of pulling a single crystal silicon having a diameter of more than 200 mm by a single-crystal silicon pulling apparatus provided with a truncated reversed-cone shape or cylindrical gas stream guide installed above the melt, the single crystal silicon and the quartz crucible are driven to rotate in reverse directions, and the rotation speed of the single crystal silicon is set to be within the range of 8 to 16 rpm and is more than twice the rotation speed of the crucible.

In addition to the above feature, in the process of pulling a semiconductor single crystal, the rotation speed of the crucible is set to its minimum value during pulling a predetermined section of the single-crystal ingot, said section of which begins from the beginning end of the single-crystal body and terminates at a location apart from the beginning end within a distance of 10% of the total length of the single-crystal body. Subsequently, the rotation speed of the crucible is gradually raised and is set to no more than a maximum value of 8 rpm.

In addition to the above two features, according to this invention, in the process of pulling a semiconductor single crystal, the flow speed of the inert gas passing through the gap between the lower end of the gas stream guide and the free surface of melt is set to its minimum value during pulling the predetermined section commencing from the beginning end of the single-crystal body and terminating at a location apart from the beginning end within a distance of 10% of the total length of the single-crystal body. Subsequently the flow speed of the inert gas is gradually raised.

A first aspect of the present invention is a method of pulling a single crystal silicon having a diameter larger than 200 mm, comprising a step of pulling up the single crystal silicon from a raw material melt in a quartz crucible, wherein the step of pulling the single crystal silicon comprises a step of driving the single crystal silicon and the quartz crucible to rotate in reverse directions, so that the rotation speed of the single crystal silicon is set within the range of 8 to 16 rpm and to be more than twice the rotating speed of the crucible during the pulling step.

A second aspect of the present invention is a method of pulling a single crystal silicon according to the first aspect, comprising the steps of: forming a neck portion; a step of forming a shoulder portion having a gradually increasing diameter; a step of forming a body portion having a constant diameter; and a step of forming a tail portion in order, wherein the rotation speed of the crucible is set at its minimum value during the term from the beginning end of the step of forming a body portion to a location apart from the beginning end within a distance of 10% of the total length of the single-crystal body. Subsequently the rotation speed of the crucible is gradually raised to no more than a maximum value of 8 rpm.

A third aspect of the invention is a method of the present invention according to the first aspect, wherein the step of pulling comprises a step of applying an inert gas with rectifying by a gas stream guide installed above the melt.

A fourth aspect of the invention is a method of the present invention according to the third aspect, wherein gas stream guide has a truncated reversed-cone shaped and is mounted above the melt so as to have a predetermined clearance between a lower end thereof and a melt surface of the melt.

A fifth aspect of the invention is a method of the present invention according to the fourth aspect, which comprises the steps of: forming a neck portion; a step of forming a shoulder portion having a diameter of gradually increasing; a step of forming a body portion having a constant diameter; and a step of forming a tail portion in order, wherein the flow speed of the inert gas passing through the clearance between the lower end of the gas stream guide and the free surface of the melt is set to its minimum value during the term from the beginning end of the step of forming a body portion to a location apart from the beginning end within a distance of 10% of the total length of the single-crystal body to a location apart from the beginning end within a distance of 10% of the total length of the single-crystal body. Subsequently the flow speed of the inert gas is gradually raised.

A sixth aspect of the invention is a method of the present invention according to the fifth aspect, wherein the rotation speed of the crucible is set at its minimum value during the term from the beginning end of the step of forming a body portion to a location apart from the beginning end within a distance of 10% of the total length of the single-crystal body. Subsequently the rotation speed of the crucible is gradually raised to no more than a maximum value of 8 rpm.

BRIEF DESCRIPTION OF THE DRAWINGS

The present invention can be more fully understood by reading the subsequent detailed description and examples with reference made to the accompanying drawings, wherein.

DETAILED DESCRIPTION OF THE PREFERRED EMBODIMENT

Figure 1A:
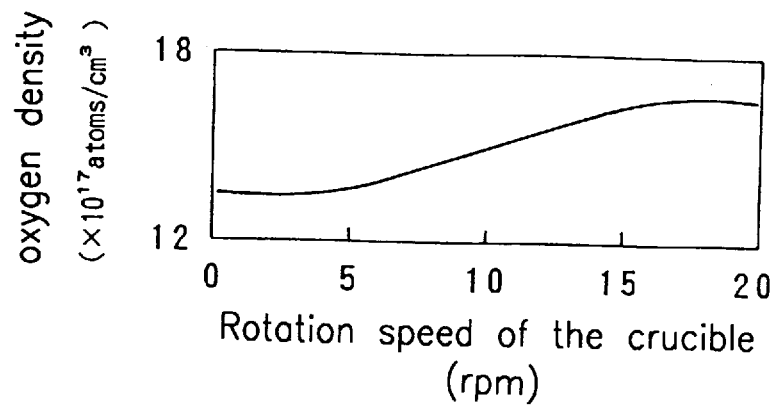
FIG. 1(a) is a graph showing the tendency of oxygen concentration in single crystals pulled with respect to the rotation speed of the crucible.
Figure 1B:
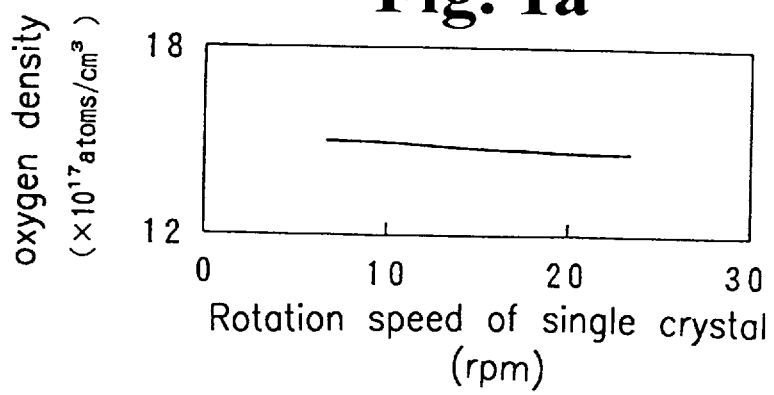
FIG. 1(b) is a graph showing the tendency of the oxygen concentration in single crystals pulled with respect to the rotation speed of single crystals being pulled.
Figure 1C:
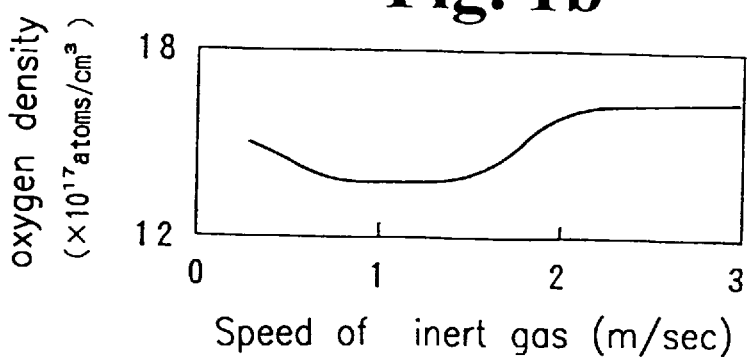
FIG. 1(c) is a graph showing the tendency of the oxygen concentration in single crystals pulled with respect to the flow speed of inert gas.

FIGS. 1(a), 1(b) and 1(c) are graphs respectively showing the tendency of oxygen concentration in single crystals pulled with respect to the affecting factors such as the rotation speed of the crucible, the rotation speed of the single crystal being pulled, and the flow speed of inert gas. As shown in FIG. 1(a) and FIG. 1(c), when the rotation speed of the crucible and the flow speed of inert gas are kept low, the oxygen concentration is also at low value. Conversely, when the rotation speed of the crucible and the flow speed of the inert gas are raised, the oxygen concentration also increases. Furthermore, when the rotation speed of the single crystal in FIG. 1(b) is raised, the oxygen concentration decreases slightly. Under this circumstance, the rotation speed of the single crystal has been set within the range of 8 to 16 rpm, thus the rotation speed of the crucible should be between 4 and 8 rpm. Consequently, a single crystal silicon with a low and uniform oxygen concentration distribution along its longitudinal axis can be obtained.

The rotation speed of the crucible is minimum near the beginning end of the single-crystal body, then is gradually raised following the proceeding of pulling and is set to no more than a maximum value of 8 rpm. Therefore, the oxygen concentration is low near the beginning end of the single-crystal body, then increases following the growth of the single crystal. The above-described increase of the oxygen concentration will be offset by the decreasing tendency of the oxygen concentration when the solidification ratio is raised. Thus, a single crystal silicon with a low and uniform oxygen concentration distribution along its total length can be obtained.

In addition to the rotation speed of the crucible and the rotation speed of the single crystal, the flow speed of inert gas can also be controlled to make the manufacture of single crystals with desired oxygen concentration much easier. As shown in FIG. 1(c), the oxygen concentration is minimum when the flow speed of inert gas is about 1 m/sec, and there is a tendency for the oxygen concentration to increase when the flow speed of inert gas approaches 2 m/sec. Therefore, the oxygen concentration is high at the beginning of forming the body of the single crystal, and the flow speed of inert gas is restricted at a low level. Then, the flow speed of inert gas is raised gradually, and the flow speed of inert gas is raised much more at the time of forming the latter half of the single crystal body. If the pulling process is performed as above, the oxygen concentration will eventually become even.

Figure 6:
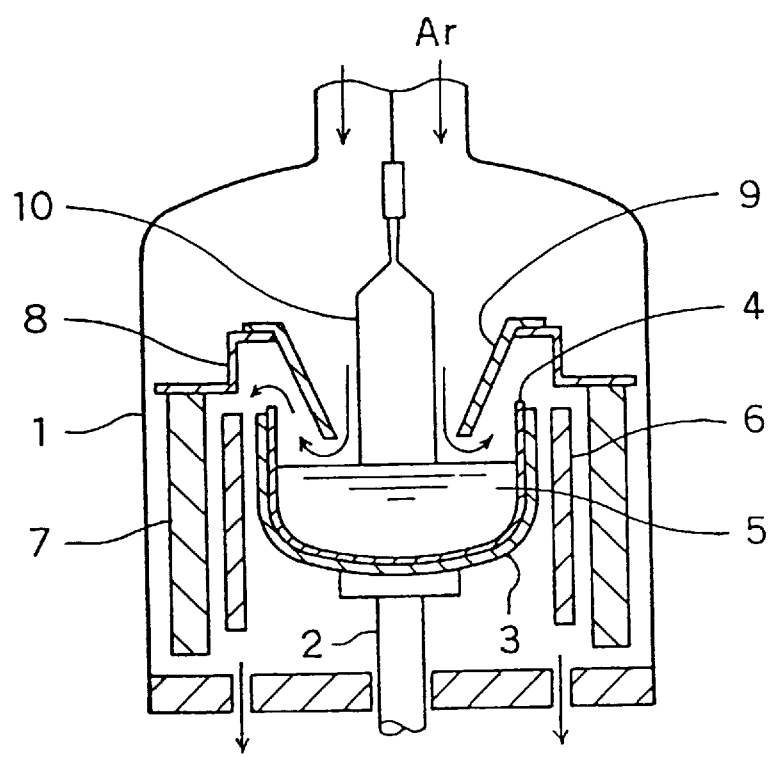
FIG. 6 is a partially cross-sectioned schematic view showing an apparatus for pulling silicon semiconductor single crystals.

The following is a description of the process of pulling single crystal according to a first embodiment of this invention with reference to the drawings. The apparatus employed in the first embodiment is the same to that of the prior art (see FIG. 6).

The single crystal silicon with low oxygen concentration pulled by the method of this invention was of the type having a diameter 210 mm, a body length 1000 mm, and an oxygen concentration, for example, below $13 \times 10^{17}$ atoms/cm$^3$. In the process of pulling the single crystal silicon, polycrystalline silicon nuggets with a weight of 100 kg were fed into the quartz crucible 4 to be melted, and the single-crystal silicon pulling apparatus was surrounded by an argon atmosphere of 20 Torr and was controlled in accordance with the predetermined pattern shown in FIGS. 2(a), 2(b), and 2(c).

Figure 2A:
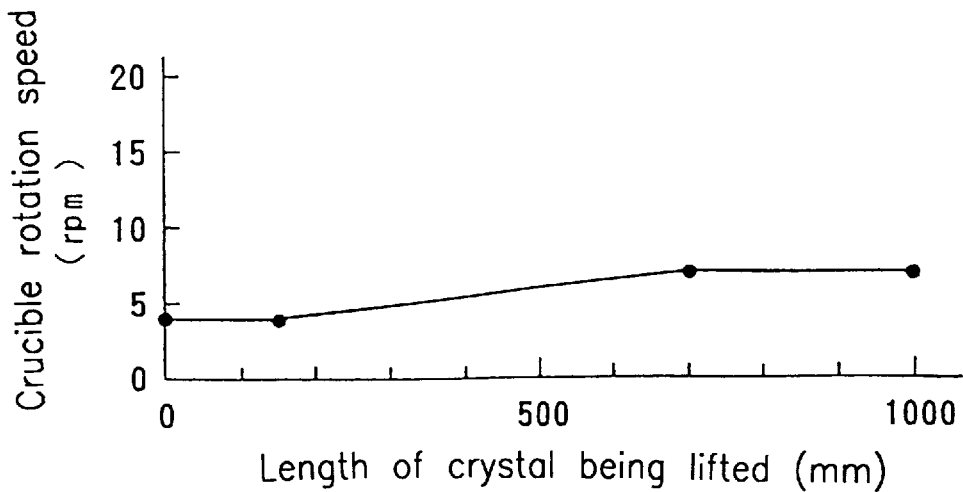
FIG. 2(a) is a graph showing the control pattern in a first embodiment, with respect to the rotation speed of the crucible during the operation of pulling single crystals with low oxygen concentration.
Figure 2B:
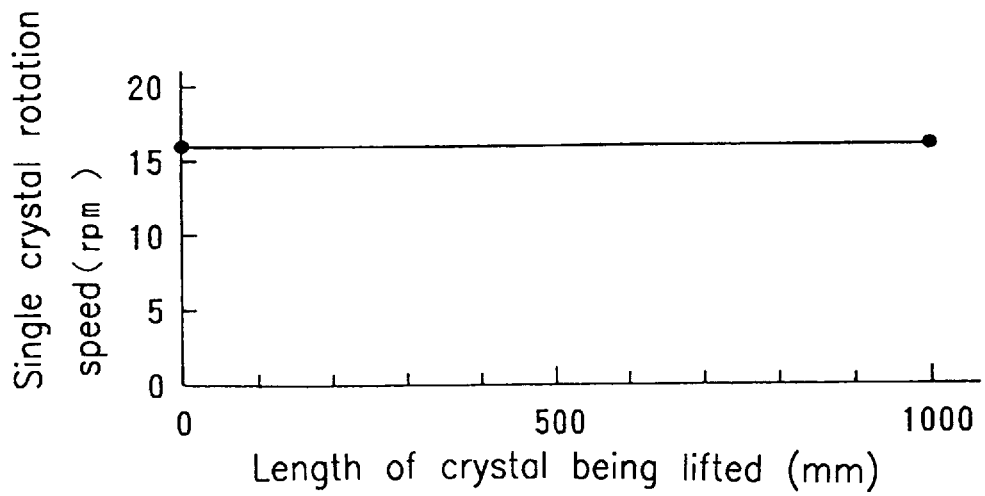
FIG. 2(b) is a graph showing the control pattern in the first embodiment, with respect to the rotation speed of the single crystal being pulled during the operation of pulling single crystals with low oxygen concentration.
Figure 2C:
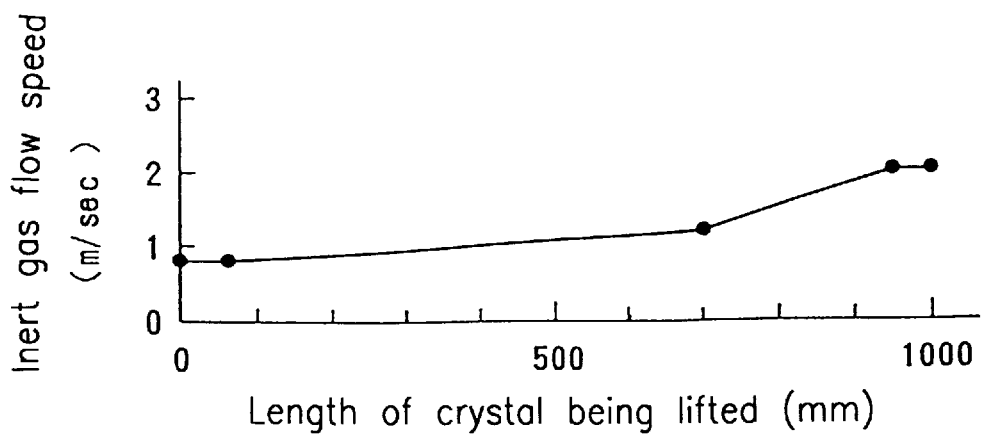
FIG. 2(c) is a graph showing the control pattern in the first embodiment, with respect to the flow speed of inert gas during the operation of pulling single crystals with low oxygen concentration.

As shown in FIG. 2(a), the rotation speed of the crucible was kept at 4 rpm from the beginning end of the body to 150 mm, then was raised gradually to reach a value of 7 rpm at 700 mm, and after that was kept at 7 rpm. As shown in FIG. 2(b), the rotation speed of the single crystal was kept at 16 rpm throughout the total length of the single crystal body. Furthermore, as shown in FIG. 2(c), the flow speed of inert gas was kept at 0.8 m/s from the beginning end of the body to 60 mm, then the flow speed of inert gas was raised gradually to reach a value of 1.2 m/s at 700 mm. After that, the flow speed of inert gas was raised gradually to reach a value of 2.0 m/s at 950 mm, and ultimately kept at that value. Furthermore, the flow speed of inert gas was adjusted by controlling the flow rate of argon coming from the pull chamber through a mass flow controller. During pulling, the interior pressure within the furnace was automatically controlled to remain at 20 Torr +−0.5 Torr through a pressure sensor and a throttle valve installed on the exhaust sidewall of the furnace.

Figure 3A:
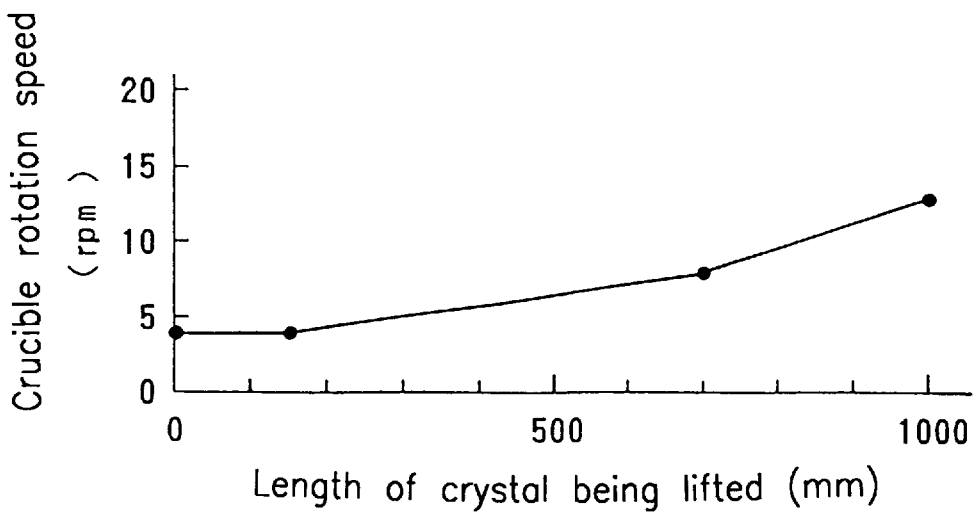
FIG. 3(a) is a graph showing the control pattern in a comparative embodiment, with respect to the rotation speed of the crucible during the operation of pulling single crystals with low oxygen concentration.
Figure 3B:
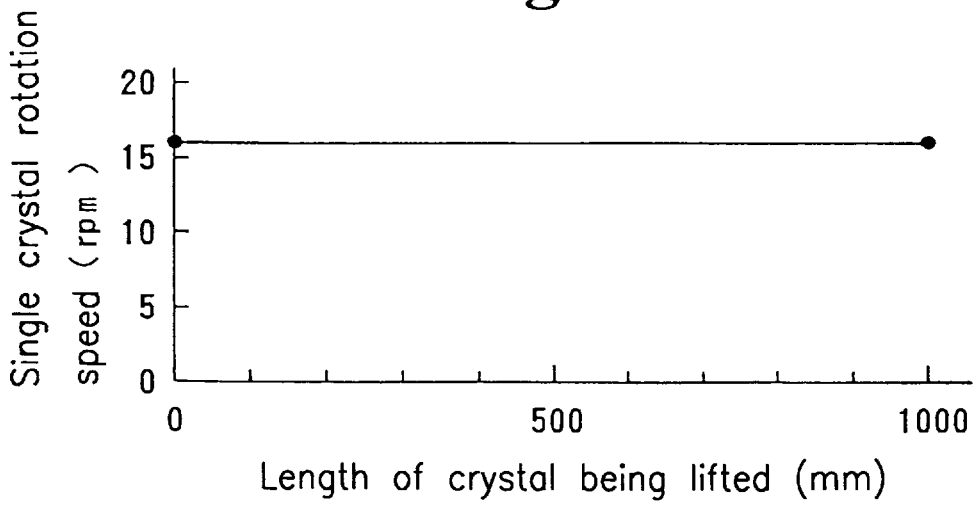
FIG. 3(b) is a graph showing the control pattern in the comparative embodiment, with respect to the rotation speed of the single crystal being pulled during the operation of pulling single crystals with low oxygen concentration.
Figure 3C:
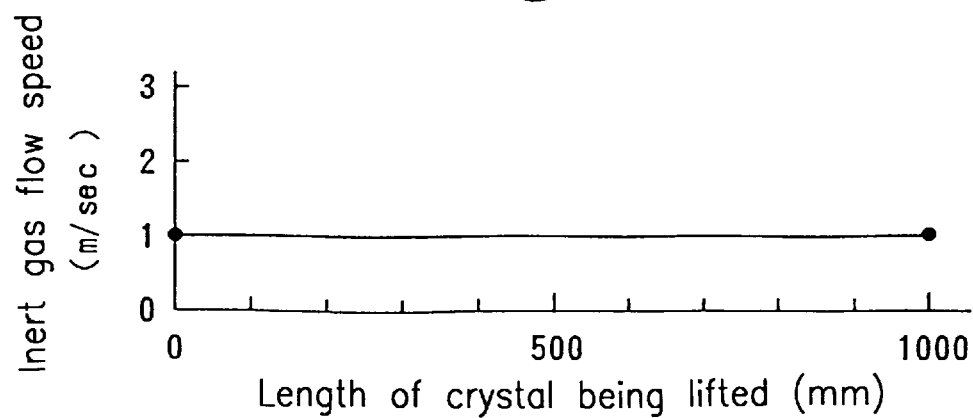
FIG. 3(c) is a graph showing the control pattern in the comparative embodiment, with respect to the flow speed of inert gas during the operation of pulling single crystals with low oxygen concentration.

FIGS. 3(a), 3(b), and 3(c) are graphs respectively showing the control patterns in an embodiment according to conventional methods in comparison with the first embodiment of this invention. As shown in FIG. 3(a), the rotation speed of the crucible was kept at 4 rpm from the beginning end of the body to 150 mm, then was raised gradually to reach a value of 8 rpm at 700 mm, after that was raised gradually to reach a value of 13 rpm at 1000 mm. As shown in FIG. 3(b), the rotation speed of the single crystal was kept at 16 rpm throughout the total length of the single crystal body. As shown in FIG. 3(c), the flow speed of inert gas was kept at 1 m/s throughout the total length of the single crystal body.

Figure 4:
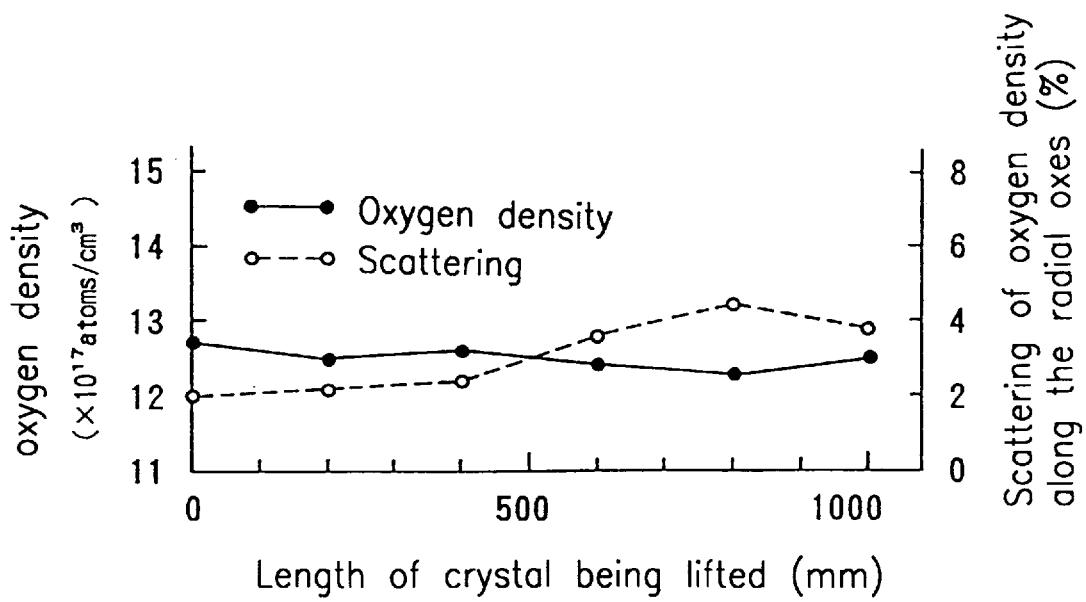
FIG. 4 is a graph showing respectively the oxygen concentration distribution along the longitudinal axis and the scattering of the oxygen concentration along the radial axes of the single crystal pulled by the method of the first embodiment shown in FIG. 2.
Figure 5:
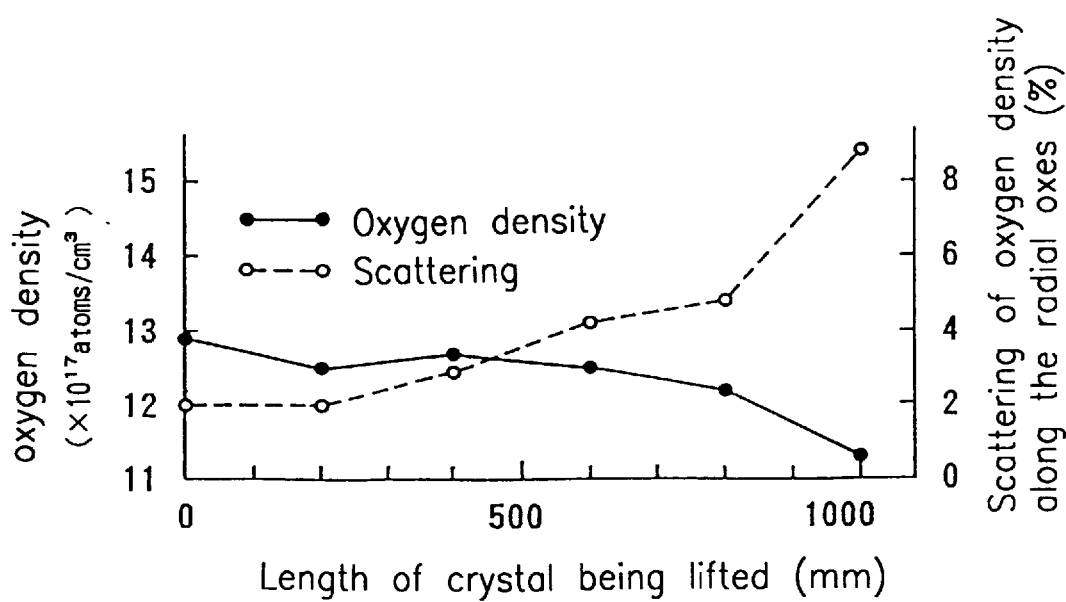
FIG. 5 is a graph showing respectively the oxygen concentration distribution along the longitudinal axis and the scattering of the oxygen concentration along the radial axes of the single crystal pulled by the method of the comparative embodiment shown in FIG. 3.

FIG. 4 is a graph showing respectively the oxygen concentration distribution along the longitudinal axis and the scattering of the oxygen concentration along the radial axes of the single crystal pulled by the method of the first embodiment shown in FIG. 2. FIG. 5 is a graph showing respectively the oxygen concentration distribution along the longitudinal axis and the scattering of the oxygen concentration along the radial axes of the single crystal pulled by the method of the comparative embodiment shown in FIG. 3. In the single crystal silicon pulled according to the first embodiment, the oxygen concentration distribution along the longitudinal axis was falling within the scope of $12-13 \times 10^{17}$ atoms/cm$^3$, and the scattering of the oxygen concentration along the radial axes did not exceed an utmost value of 4.4%. On the contrary, in the single crystal silicon pulled according to the comparative embodiment, the oxygen concentration distribution along the longitudinal axis could not be adjusted properly, and the oxygen concentration at the location beyond 800 mm decreased distinctly. Furthermore, it was intended to adjust the oxygen concentration by raising the rotation speed of the crucible. However, the scattering of the oxygen concentration along the radial axes increased gradually and reached a value of 8.8% at the end portion of the body.

From the result shown in FIG. 4, it is obvious that the pulling method according to this invention is superior to conventional methods in the constancy of the oxygen concentration along the longitudinal and radial axes. Compared to conventional methods, in the method according to this invention, the rotation speeds of the crucible and the single crystals can be reduced. Thus, it is possible to grow single crystals steadily. The process according to this invention has been described as above. In the process of manufacturing single crystals having a diameter of more than 200 mm, the rotation speed of the crucible, the rotation speed of the single crystal, and the flow speed of inert gas can be controlled. Thus, the oxygen concentration contained in the single crystals can be concisely controlled, and single crystals with even distributions of oxygen concentration along their longitudinal and radial axes can be obtained.

What is claimed is:

1. A method of pulling a single silicon crystal having a diameter larger than 200 mm, comprising the step of:

pulling up the single silicon crystal from a raw material melt in a quartz crucible, wherein the pulling step of the single silicon crystal comprises:

driving the single silicon crystal and the quartz crucible to rotate in reverse directions, so that the rotation speed of the single silicon crystal is set within the range of 8 to 16 rpm and is more than twice the rotating speed of the crucible during the pulling step.

2. The method of pulling a single silicon crystal as claimed in claim 1, further comprising the steps of:

forming a neck portion;

forming a shoulder portion having a gradually increasing diameter;

forming a single crystal body portion having a constant diameter; and forming a tail portion, in that order, wherein the rotation speed of the crucible is set at its minimum value during the term from the beginning end of the forming step of the body portion to a location apart from the beginning end within a distance of 10% of the total length of the single crystal body, and wherein subsequently, the rotation speed of the crucible is gradually raised to no more than a maximum value of 8 rpm.

3. The method of pulling a single silicon crystal as claimed in claim 1, wherein the pulling step comprises:

applying a rectifying inert gas by a gas stream guide installed above the melt.

4. The method of pulling a single silicon crystal as claimed in claim 3, wherein the gas stream guide has a truncated reversed-cone shape and is mounted above the melt so as to have a clearance between a lower end thereof and a melt surface of the melt.

5. A method of pulling a single silicon crystal having a diameter larger than 200 mm, comprising the step of:

pulling up the single silicon crystal from a raw material melt in a quartz crucible, wherein the pulling step of the single silicon crystal comprises:

driving the single silicon crystal and the quartz crucible to rotate in reverse directions, so that the rotation speed of the single silicon crystal is set within the range of 8 to 16 rpm and is more than twice the rotating speed of the crucible during the pulling step;

forming a neck portion;

forming a shoulder portion having a gradually increasing diameter;

forming a single crystal body portion having a constant diameter; and forming a tail portion, in that order, wherein the rotation speed of the crucible is set at its minimum value during the term from the beginning end of the forming step of the body portion to a location apart from the beginning end within a distance of 10% of the total length of the single crystal body, and wherein subsequently, the rotation speed of the crucible is gradually raised to no more than a maximum value of 8 rpm;

wherein the pulling step further comprises the step of:

applying a rectifying inert gas by a gas stream guide installed above the melt; and wherein the gas stream guide has a truncated reversed-cone shape and is mounted above the melt so as to have a clearance between a lower end thereof and a melt surface of the melt; and wherein the flow speed of the inert gas passing through the clearance between the lower end of the gas stream guide and the free surface of the melt is set to its minimum value during the term from the beginning end of the forming step of the body portion to a location apart from the beginning end within a distance of 10% of the total length of the single crystal body, and wherein subsequently, the flow speed of the inert gas is gradually raised.

6. The method of pulling a single silicon crystal as claimed in claim 5, wherein the rotation speed of the crucible is set at its minimum value during the term from the beginning end of the forming step of the body portion to a location apart from the beginning end within a distance of 10% of the total length of the single crystal body, and wherein subsequently, the rotation speed of the crucible is gradually raised to no more than a maximum value of 8 rpm.

7. A method of pulling a single silicon crystal having a diameter larger than 200 mm, comprising the step of:

pulling up the single silicon crystal from a raw material melt in a quartz crucible, wherein the pulling step of the single silicon crystal comprises:

driving the single silicon crystal and the quartz crucible to rotate in reverse directions, so that the rotation speed of the single silicon crystal is set within the range of 8 to 16 rpm and is more than twice the rotating speed of the crucible during the pulling step; and applying a rectifying inert gas by a gas stream guide installed above the melt.

* * * * *